United States Patent [19]
Muhmenthaler et al.

[11] Patent Number: 5,497,350
[45] Date of Patent: Mar. 5, 1996

[54] INTEGRATED SEMICONDUCTOR MEMORY DEVICE CAPABLE OF SWITCHING FROM A MEMORY MODE TO AN INTERNAL TEST MODE

[75] Inventors: Peter Muhmenthaler, München; Hans-Dieter Oberle, Puchheim, both of Germany

[73] Assignee: Siemens Aktiengesellschaft, München, Germany

[21] Appl. No.: 366,361

[22] Filed: Dec. 29, 1994

Related U.S. Application Data

[63] Continuation of Ser. No. 707,639, May 30, 1991, abandoned.

[30] Foreign Application Priority Data

May 31, 1990 [EP] European Pat. Off. .............. 90110393

[51] Int. Cl.$^6$ ........................ G11C 7/00; G11C 29/00
[52] U.S. Cl. .................... 365/201; 371/22.5; 371/1.5
[58] Field of Search ..................... 365/201, 200; 371/21.1, 21.4, 22.5, 21.2, 21.3, 21.5, 22.6

[56] References Cited

U.S. PATENT DOCUMENTS

| | | | |
|---|---|---|---|
| 4,686,456 | 8/1987 | Furuyama et al. | 371/21.5 |
| 4,811,299 | 3/1989 | Miyazawa et al. | 371/21.1 |
| 4,811,344 | 3/1989 | Chauvel et al. | 371/22.1 |
| 4,910,735 | 3/1990 | Yamashita | 371/22.1 |
| 4,992,985 | 2/1991 | Miyazawa et al. | 371/21.1 |
| 5,012,180 | 4/1991 | Dalrymple et al. | 371/22.1 |
| 5,016,220 | 5/1991 | Yamagata | 371/21.1 |
| 5,048,019 | 9/1991 | Albertsen | 371/21.1 |
| 5,060,198 | 10/1991 | Kowalski | 371/22.1 |
| 5,117,393 | 5/1992 | Miyazawa et al. | 371/21.1 |
| 5,132,973 | 7/1992 | Obermeyer | 371/21.1 |
| 5,301,199 | 4/1994 | Ikenaga et al. | 371/22.5 |
| 5,365,481 | 11/1994 | Sawada | 365/201 |
| 5,400,281 | 3/1995 | Morigami | 365/201 |

FOREIGN PATENT DOCUMENTS 0310111  4/1989  European Pat. Off. .

OTHER PUBLICATIONS

Proceedings of the International Test Conference 1989, Aug. 29–31, 1989, pp. 819–828, IEEE, New York.
Elektronik, vol. 39, No. 7, Mar. 30, 1990, pp. 38–47, München, D.E.: Ritter et al "Selbsttest von Prozessor–Chips".
Mikrdelektronik, vol. 4 (1990) No. 1, pp. 28–31, Oberle et al: "Testen von Dynamischen Halbleiterspeichern".
Mikroelektronik, vol. 4 (1990) No. 1, pp. 12–31, Meyer et al: "Video–Ram als Anwendungsorientierte Dynamische Halbleiterspeicher".

*Primary Examiner*—Georgia Y. Epps
*Assistant Examiner*—Tan Dinh
*Attorney, Agent, or Firm*—Herbert L. Lerner; Laurence A. Greenberg

[57] ABSTRACT

A semiconductor memory is subdivided into a plurality of function units and has m leads addressable from outside, internal signal lines leading from the function units to the leads, internal signal lines connecting the function units with one another, and a test unit recognizing a test mode from a code word applied to k leads, where k≦m. A device switches over from a memory mode to the test mode. The test unit decouples at least one of the signal lines leading to the leads from an associated lead of the semiconductor memory and connects the lead to an internal signal line connecting the function units.

10 Claims, 1 Drawing Sheet

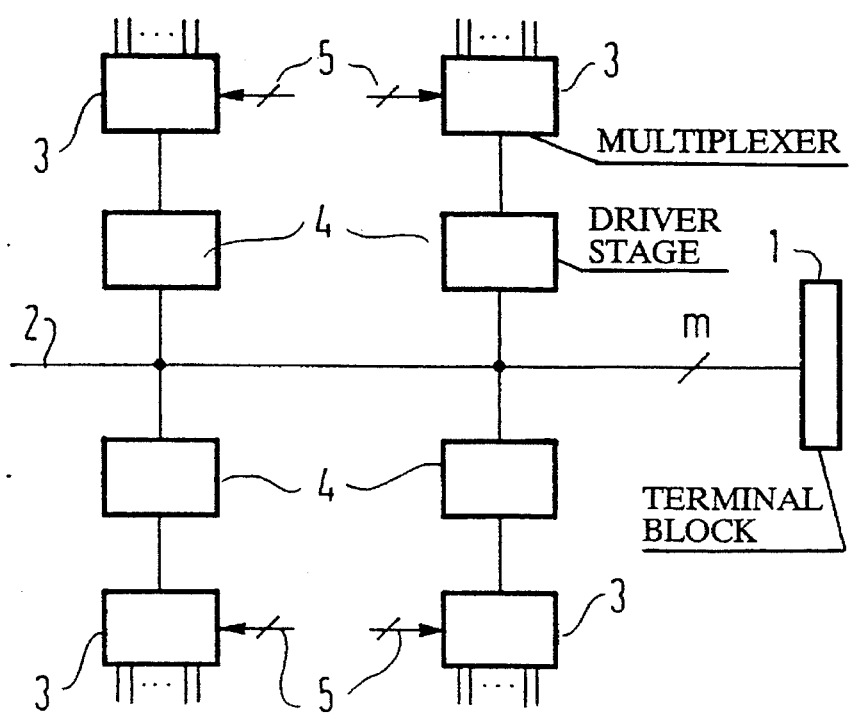
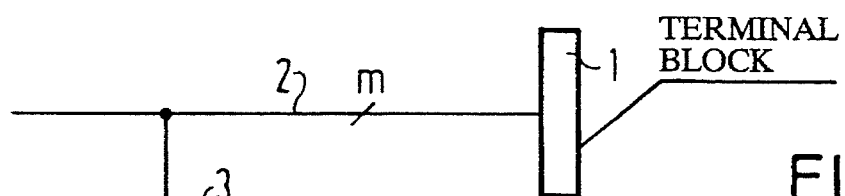
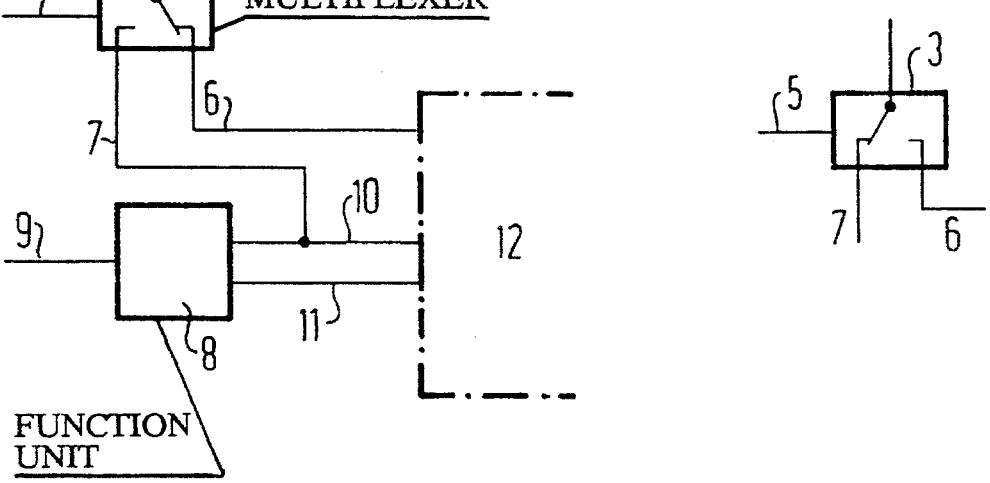

INTEGRATED SEMICONDUCTOR MEMORY DEVICE CAPABLE OF SWITCHING FROM A MEMORY MODE TO AN INTERNAL TEST MODE

This application is a continuation of application Ser. No. 07/707,639, filed May 30, 1991, now abandoned.

BACKGROUND OF THE INVENTION

1. Field of the Invention

The invention relates to an integrated semiconductor memory which is subdivided into a plurality of function units, having m leads addressable from the outside, internal signal lines leading from the function units to the leads, internal signal lines connecting the function units with one another, and a test unit recognizing a test mode from a code word applied to k ($k \leq m$) leads.

2. Description of the Related Art

Block circuit diagrams of various semiconductor memories are shown in the journal Mikroelektronik [Microelectronics], Vol. 4 (1990), No. 1, pp. 12–31, and more specifically pages 13/15 discuss video RAMs; pages 18/20 discuss SRAMs; and page 28 discusses DRAMs. As can be seen therein, the semiconductor memory is divided into several function blocks, such as cell fields, bit-word line decoders, clock generators, and so forth. Each of the function blocks can be further subdivided into smaller units. In large-scale integrated semiconductor memories, test units are usually provided as well, which are intended to permit effective, rapid testing of the memory cells.

In the course of large-scale integration of semiconductor memories, it is not only the memory capacity but also the number and complexity of peripheral function units that increase. For instance, a selection can be made between various forms of organization and modes of operation of the semiconductor memory. For each new operating mode, the entire memory, in other words all of its memory cells, must sometimes be tested. Purposeful testing of an individual function unit is impossible in current semiconductor memories. If an individual function unit is not functioning perfectly or if it is completely defective, conclusions must be drawn, for instance by suitable interpretation, as to which function unit is defective, by testing the memory cells. Often that can only be done with difficulty, or an incorrect conclusion is drawn. In the development phase of a semiconductor memory as well, it would be highly advantageous to test targeted individual function units, in order to shorten the development times. Finally, the testing and analysis time for a semiconductor memory can be considerably shortened if the most important function units of the semiconductor memory are tested first, and then the interaction of the function units is checked in usually simpler tests.

SUMMARY OF THE INVENTION

It is accordingly an object of the invention to provide an integrated semiconductor memory, which overcomes the hereinafore-mentioned disadvantages of the heretofore-known devices of this general type and which makes it possible to test targeted individual function units of the semiconductor memory.

With the foregoing and other objects in view there is provided, in accordance with the invention, in a semiconductor memory being subdivided into a plurality of function units and having m leads being accessible or addressable from outside, internal signal lines leading from the function units to the leads, internal signal lines connecting the function units with one another, and a test unit recognizing a test mode from a code word applied to k leads, where $k \leq m$, the improvement comprising means for switching over from a memory mode to the test mode, the test unit decoupling at least one of the signal lines leading to the leads from an associated lead of the semiconductor memory and connecting the lead to an internal signal line connecting the function units.

In accordance with another feature of the invention, the semiconductor memory includes a data bus having data bus lines connected to the leads; and there is provided at least one multiplexer having an output connected to one of the data bus lines, a first input supplied with an internal signal necessary for the associated data bus line in the memory mode, and at least one second input each being connected to a respective signal line connecting the function units.

In accordance with a further feature of the invention, the test unit generates signals necessary for testing a function unit.

In accordance with an added feature of the invention, the semiconductor memory has first connection pads and a second connection pad, and there are provided means for supplying a signal to the second connection pad for switching over from the memory mode to the test mode.

In accordance with an additional feature of the invention, there are provided means for applying another code word to k leads, where $k \leq m$, for ending the test mode.

In accordance with yet another feature of the invention, there are provided means for effecting an end of the test mode and a transition to the memory mode after a given number of cycles.

In accordance with yet a further feature of the invention, the code word is a first code word, and there are provided means for selecting one of $2^n$ testable function units with a second code word present at n leads, where $n+k \leq m$, while the first code word is present at the leads.

In accordance with yet an added feature of the invention, there are provided means for switching over within a single cycle with respect to the memory mode.

In accordance with a concomitant feature of the invention, there are provided means for switching on the test mode with a first code word in a first cycle, and subsequently selecting various function and test units in further cycles with second code words.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of a portion of a semiconductor memory according to the invention;

FIG. 2 is a schematic and block circuit diagram of another portion of a semiconductor memory according to the invention, having a multiplexer in a memory mode position; and FIG. 3 is a schematic circuit diagram of the multiplexer of FIG. 2, in a test mode position.

DESCRIPTION OF THE PREFERRED EMBODIMENT

Referring now to the figures of the drawing in detail and first, particularly, to FIG. 1 thereof, there is seen a portion of a semiconductor memory in which regions thereof that are unimportant to the invention have been omitted, for the sake of simplicity. A block 1 in FIG. 1 schematically represents a region of connection terminals and connection pads PD. The leads or terminals of the block 1 are connected to a bus 2 including m lines. The semiconductor memory according to the invention additionally has a multiplexer 3. The bus 2 is connected to the output of a plurality of the multiplexers 3. Such multiplexers are known from a book entitled Halbleiter-Schaltungstechnik [Electronic Circuits, Design and Applications] by Tietze and Schenk, 8th Edition (1986) page 224, and can assure unidirectional or bidirectional signal transmission, depending on the signal to be switched. This can be done through driver stages 4, as shown in FIG. 1. The multiplexers 3 are controlled through control inputs 5 by a non-illustrated test unit. The inputs of the multiplexers 3 are connected both to signal lines that are necessary for memory operation and to internal node points of the internal signal lines of the semiconductor memory that are necessary for various test mode types.

In the memory mode, the multiplexers 3 connect the signal lines necessary for memory operation to the bus 2. This bus 2 carries the signals necessary for memory operation to the leads or terminals of the block 1. The semiconductor memory then behaves like a conventional memory component. Switching the semiconductor memory to the test mode is preferably performed according to the JEDEC standard, with a "write-enable and CAS before RAS cycle". However, switching to the test mode could also be performed by applying a certain signal level to an additional pad. The test unit recognizes this signal level and switches over the semiconductor memory to the test mode. During this switchover cycle, the test unit recognizes a code word present at k address leads, which signals the test unit to switch the semiconductor memory over to a certain test mode. An additional code word which selects the function module to be tested can be applied through a further number e of address inputs of the semiconductor memory. For instance, in a 16M memory, the code word for the test mode is applied to address pins A0–A7. A maximum of 16 different function units can then be selected by means of the further code word applied to the address pins A8–A11. If the function unit to be checked generates more signals than there are data leads or terminals, then a subdivision into subfunction units is necessary. For instance, this can be performed through a third code word, which is applied to the data inputs of the semiconductor memory upon switchover to the test mode. After the switchover cycle, the semiconductor memory behaves as in the memory mode, except that function unit input and output signals to be tested of are applied to the data lines of the semiconductor memory, for instance. In this way, it is assured that internal states can be comprehensively controlled and observed. The return to the normal mode requires a special cycle, corresponding to the switchover to the test mode. However, for this purpose only a first, special code word, which is applied to the address pins A0–A7, is necessary. Alternatively, however, an automatic return to the normal mode could also be implemented. For instance, that could be assured after a given maximum number of operating cycles.

FIGS. 2 and 3 show the switchover to the test mode for testing a simple function unit. The portion of a semiconductor memory shown in FIG. 2 again has a bus 2 with m lines, which is connected both to the leads or terminals of the block 1 of the semiconductor memory and to the output of a multiplexer 3. The multiplexer is controlled by a control line 5 and has two inputs, which are connected to first and second signal lines 6 and 7. A test unit TU is connected to the control line 5 in FIGS. 2 and 3 and an additional connection pad PDx is connected to the test unit TU in FIG. 2. The function unit to be tested is identified in this case by reference numeral 8. The function unit 8 has one input line 9 and two output lines 10, 11. The output lines 10, 11 lead to a block 12, which symbolically represents further function units of the semiconductor memory. The first input line 6 leading to the multiplexer is supplied with an output signal from the block 12. The second input line 7 of the multiplexer is connected to the output line 10.

In the memory mode, the multiplexer 3 connects the first signal line 6 to the bus 2, as shown in FIG. 2. The function unit 8, which may be a clock generator, is controlled by the signal present at the input line 9 and generates two output signals, for instance, which are delivered through the lines 10, 11 to further function units contained in the block 12. These further function units in the block 12 then generate an output signal, for instance a data signal representing the data contents of one memory cell, and this signal is delivered to a connection terminal contained in the block 1 through the first data line 6, the multiplexer 3 and the bus 2.

It is assumed that the output signal 10 is of particular importance for testing the function unit 8. The circuit shown in FIG. 2 then makes it possible to connect this signal line to the connection terminal contained in the block 1, through the multiplexer 3 and the bus 2. The multiplexer 3 is controlled through the control line 5 in such a way that it connects the signal line 7 to the bus 2. This state of the multiplexer 3 is shown in FIG. 3. The signal line 6 is then decoupled from the bus. The switchover of the multiplexer is performed within the test mode activation cycle. During the next cycles of the semiconductor memory, the semiconductor memory can be triggered as in the memory mode. The semiconductor memory then continues to operate as in the memory mode, except that rather than the data signal generated in the normal mode, it is the output signal of the function unit 8 that is applied to a connection terminal contained in the block 1. This output signal can then be observed by the tester during normally elapsing memory functions.

The test circuit according to the invention can be used for all types of memories such as SRAMs, DRAMs, video RAMs, and so forth.

We claim:

1. In a semiconductor memory being subdivided into a plurality of function units and having m leads addressable from outside, first internal signal lines leading from the function unite to the m leads, second internal signal lines connecting the function units with one another, and an internal test unit recognizing a test mode from a code word applied to k of said m leads, where k≦m, the improvement comprising means for switching over from a memory mode to the test mode, the test unit decoupling at least one of the first signal lines leading to the m leads from a respective one of the m leads and connecting the respective one of the m leads to one of the second internal signal lines connecting the function units, for testing one of the function units being connected via the second internal signal with the respective one of the m leads in the test mode.

2. The semiconductor memory according to claim 1, wherein the semiconductor memory includes a data bus having data bus lines connected to said m leads; and including at least one multiplexer having an output connected to one of said data bus lines, a first input supplied with an internal signal necessary for the associated data bus line in the memory mode, and at least one second input each being connected to a respective one of said second internal signal lines.

3. The semiconductor memory according to claim 1, wherein said test unit generates signals necessary for testing one of said function units.

4. The semiconductor memory according to claim 1, having first connection pads and a second connection pad, and including means for supplying a signal to said second connection pad for switching over from the memory mode to the test mode.

5. The semiconductor memory according to claim 1, including means for applying another code word to said k of said m leads, where $k \leq m$, for ending the test mode.

6. The semiconductor memory according to claim 1, including means for effecting an end of the test mode and a transition to the memory mode after a given number of cycles.

7. The semiconductor memory according to claim 1, wherein the code word is a first code word, and including means for selecting one of $2^n$ testable function units with a second code word present at n of said m leads, where $n+k \leq m$, while the first code word is present at said k of said m leads.

8. The semiconductor memory according to claim 1, including means for switching over within a single cycle with respect to the memory mode.

9. The semiconductor memory according to claim 1, including means for switching on the test mode with said first code word in a first cycle, and subsequently selecting various function and test units in further cycles with second code words.

10. A semiconductor memory, comprising a plurality of function units subdividing the semiconductor memory, m leads addressable from outside the semiconductor memory, first internal signal lines leading from said function units to m said leads, second internal signal lines connecting said function units with one another, an internal test unit recognizing a test mode from a code word applied to k of the m leads, where $k \leq m$, and means disposed in the semiconductor memory for switching over from a memory mode to the test mode, said test unit decoupling at least one of said first internal signal lines leading to said m leads from a respective one of said m leads in the test mode and connecting the respective one of said m leads to one of said second internal signal lines, for testing a respective one of said function units connected to the respective one of said m leads.

* * * * *